（12）United States Patent
Kim et al.

(10) Patent No.: US 9,122,324 B2
(45) Date of Patent: Sep. 1, 2015

(54) THIN FILM TRANSISTOR DISPLAY PANEL AND MANUFACTURING METHOD THEREOF

(75) Inventors: Duk-Sung Kim, Asan-si (KR); Hyuk-Jin Kim, Asan-si (KR); Young Jae Tak, Yongin-si (KR)

(73) Assignee: Samsung Display Co., Ltd. (KR)

( * ) Notice: Subject to any disclaimer, the term of this patent is extended or adjusted under 35 U.S.C. 154(b) by 204 days.

(21) Appl. No.: 13/527,393

(22) Filed: Jun. 19, 2012

(65) Prior Publication Data

US 2013/0229400 A1 Sep. 5, 2013

(30) Foreign Application Priority Data

Mar. 5, 2012 (KR) .................. 10-2012-0022391

(51) Int. Cl.
*G02F 1/1345* (2006.01)
*G06F 3/038* (2013.01)
*H01L 27/12* (2006.01)
*H01L 29/40* (2006.01)

(52) U.S. Cl.
CPC .............. *G06F 3/038* (2013.01); *G02F 1/1345* (2013.01); *H01L 27/124* (2013.01)

(58) Field of Classification Search
CPC .......... G09G 3/36; G09G 9/00; G02F 1/1345; G02F 1/1343; G02F 1/136; H01L 51/50; G09F 9/00; G09F 9/35
USPC .................... 257/59; 345/92, 98; 349/143
See application file for complete search history.

(56) References Cited

U.S. PATENT DOCUMENTS

| 2008/0204392 | A1* | 8/2008 | Han et al. ................... 345/92 |
| 2010/0066967 | A1* | 3/2010 | Takahashi et al. ............ 349/143 |
| 2010/0171687 | A1* | 7/2010 | Chiang et al. ................ 345/98 |
| 2011/0079783 | A1* | 4/2011 | Choi .............................. 257/59 |

FOREIGN PATENT DOCUMENTS

| JP | 01-302396 A | 6/1989 | |
| JP | 06-011721 A | 1/1994 | |
| JP | 11305681 A | * 11/1999 | ............... G09F 9/00 |

OTHER PUBLICATIONS

Machine Translation of JPO document, JP 11305681 A, Nov. 5, 1999.*

* cited by examiner

*Primary Examiner* — Claire X Pappas
*Assistant Examiner* — Abdul-Samad A Adediran
(74) *Attorney, Agent, or Firm* — Innovation Counsel LLP

(57) ABSTRACT

A thin film transistor display panel capable of minimizing a bezel and a manufacturing method thereof are provided. The thin film transistor display panel includes: a substrate; a plurality of gate lines and data lines that cross each other on the substrate; a thin film transistor connected to the gate line and the data line; a pixel electrode connected to the thin film transistor; and a plurality of gate voltage supply lines arranged in a parallel direction with the data lines and connected to the plurality of gate lines, respectively, in which one pixel area is defined by two adjacent gate lines and two adjacent data lines, two pixel electrodes are formed in one pixel area, and the gate voltage supply lines pass between the two pixel electrodes formed in the same pixel area.

9 Claims, 14 Drawing Sheets

THIN FILM TRANSISTOR DISPLAY PANEL AND MANUFACTURING METHOD THEREOF

CROSS-REFERENCE TO RELATED APPLICATION

This application claims priority to and the benefit of Korean Patent Application No. 10-2012-0022391 filed in the Korean Intellectual Property Office on Mar. 5, 2012, the entire contents of which are incorporated herein by reference.

BACKGROUND OF THE INVENTION (a) Field of the Invention

The present invention relates to a thin film transistor display panel and a manufacturing method thereof, and more particularly, to a thin film transistor display panel capable of minimizing a bezel and a manufacturing method thereof.

(b) Description of the Related Art

In general, a thin film transistor (TFT) is used as a switching element for independently driving each of the pixels in a flat panel display device such as a liquid crystal display or an organic light emitting diode display. The thin film transistor display panel having the thin film transistor includes a pixel electrode connected to the thin film transistor, a gate line transferring a gate signal to the thin film transistor, a data line transferring a data signal to the thin film transistor, and the like.

The thin film transistor includes a gate electrode connected to the gate line, a source electrode connected to the data line, a drain electrode connected to the pixel electrode, a semiconductor layer disposed on the gate electrode between the source electrode and the drain electrode, and the like. The thin film transistor transfers a data signal received through the data line to the pixel electrode in response to a gate signal received through the gate line.

On a thin film transistor display panel, a gate driver for supplying the gate signal to the gate line and a data driver for supplying the data signal to the data line are formed. Generally, the gate driver is formed at a left side and/or a right side of an area where a screen image is displayed, and the data driver is formed at an upper side and/or a lower side of the area where the screen image is displayed. An edge region of the thin film transistor display panel outside of the area where an image is displayed and where the gate driver and the data driver are formed is referred to as a bezel.

Because the bezel is a region where the screen image is not displayed, it is helpful to minimize the bezel. In particular, in the case in which multiple displays are used displays one image by combining a plurality of display devices, such that a single image is displayed over multiple screens, there is a problem in that an exact screen may not be displayed at interfaces of the display devices by the bezel.

The above information disclosed in this Background section is only for enhancement of understanding of the background of the invention and therefore it may contain information that does not form the prior art that is already known to a person of ordinary skill in the art.

SUMMARY OF THE INVENTION

A thin film transistor display panel is provided to display an exact screen at an interface of each display device in a multi-screen display by minimizing a bezel. A manufacturing method thereof is also provided.

In one aspect, a thin film transistor display panel includes: a substrate; a plurality of gate lines and data lines which cross each other on the substrate; thin film transistors connected to the gate lines and the data lines; a pixel electrode connected to each of the thin film transistors; and a plurality of gate voltage supply lines arranged on the substrate in a parallel direction with the data lines and each connected to one of the plurality of gate lines, in which a pixel area is defined by two adjacent gate lines and two adjacent data lines, and the gate voltage supply lines pass between two pixel electrodes formed in the same pixel area.

The plurality of gate voltage supply lines may extend from one side edge of the substrate to a gate line closest to an opposite side edge of the substrate.

The plurality of gate voltage supply lines may be substantially the same lengths.

The thin film transistor display panel may further include connection parts connecting the gate voltage supply lines and the gate lines with each other.

Each of the plurality of gate voltage supply lines may extend from one side edge of the substrate to a different one of the connection parts, respectively.

The connection part may include contact holes in the gate insulating layer disposed around an intersection of the gate line and the gate voltage supply line and in the passivation layer disposed at the intersection of the gate line and the gate voltage supply line and around the intersection to exposed a portion of the gate line and the gate voltage supply line; and a connection electrode that covers the gate line and the gate voltage supply line exposed by the contact holes to connect the gate line to the gate voltage supply line.

The connection electrode may be on the same layer as the pixel electrode and with a same material as the pixel electrode.

The connection part may further include a contact hole in the gate insulating layer disposed at the intersection of the gate line and the gate voltage supply line to expose a portion of the gate line, in which the gate voltage supply line is connected to the gate line through the contact hole.

The thin film transistor display panel may further include a driving unit connected to the gate voltage supply line and the data line.

The driving unit may supply a gate signal to the gate voltage supply line and supply a data signal to the data line.

The thin film transistor may be alternately disposed at one side and an opposite side of the data line.

Two thin film transistors which are connected to the same data line and disposed between two adjacent gate lines may be connected to different gate lines.

In another aspect, a manufacturing method of a thin film transistor display panel is provided, including: forming a plurality of gate lines on a substrate; forming a gate insulating layer on the gate line; forming a plurality of data lines and a plurality of gate voltage supply lines on the gate insulating layer so as to cross the gate lines; forming a passivation layer on the data lines and the gate voltage supply lines; and forming two pixel electrodes on the passivation layer in a pixel area defined by two adjacent gate lines and two adjacent data lines, in which the gate voltage supply lines are formed to pass between the two pixel electrodes formed in the same pixel area and each voltage supply line is connected to one of the plurality of gate lines.

The method may further include forming gate electrodes protruding from the gate lines may further be formed, forming a semiconductor layer on the gate insulating layer, and forming source electrodes protruding from the data lines onto the gate electrodes and drain electrodes separated from the source electrodes.

The method may further include forming a contact hole by etching the gate insulating layer and the passivation layer at an intersection of one of the gate lines and one of the gate voltage supply lines and around the intersection so that a portion of the gate line and the gate voltage supply line is exposed, and forming a connection electrode covering the portion of the gate line and the gate voltage supply line exposed by the contact hole to connect the gate line and the gate voltage supply line.

The method further includes forming a contact hole by etching the gate insulating layer disposed at the intersection of one of the gate lines and one of the gate voltage supply lines so that a portion of the gate line is exposed, in which the forming of the gate voltage supply line includes connecting the gate voltage supply line with the gate line through the contact hole.

The thin film transistor includes one of the gate electrodes, the semiconductor layer, and one of the source electrodes and drain electrodes overlapping the gate electrode. Two thin form transistors connected to the same data line and disposed between two adjacent gate lines are connected to different gate lines, and the two thin film transistors are disposed on opposite sides of the same data line.

Forming the plurality of gate voltage supply lines may include extending the plurality of gate voltage supply lines from one side edge of the substrate to a gate line closest to an opposite side edge of the substrate. Forming the plurality of gate voltage supply lines may include extending each of the plurality of gate voltage supply liens from one side edge of the substrate to a point connected with one of the gates lines.

The method may further include forming a driving unit connected with the gate voltage supply line and the data line.

In such display panel, a gate driver disposed at the left side and the right side of the thin film transistor display panel can be omitted by forming a gate voltage supply line connected with a gate line in a parallel direction with a data line, such that it is possible to reduce a bezel.

Further, the gate voltage supply line and the data line are formed with one pixel electrode interposed therebetween, such that it is possible to prevent signal distortion from being generated due to capacitance and a coupling effect between both wirings.

In addition, all the gate voltage supply lines may be formed with the same length to have the same area overlapped with the gate line, such that capacitance generated by the overlap of the gate voltage supply line and the gate line can be equally formed for every gate voltage supply line.

DETAILED DESCRIPTION OF THE EMBODIMENTS

Figure 1:
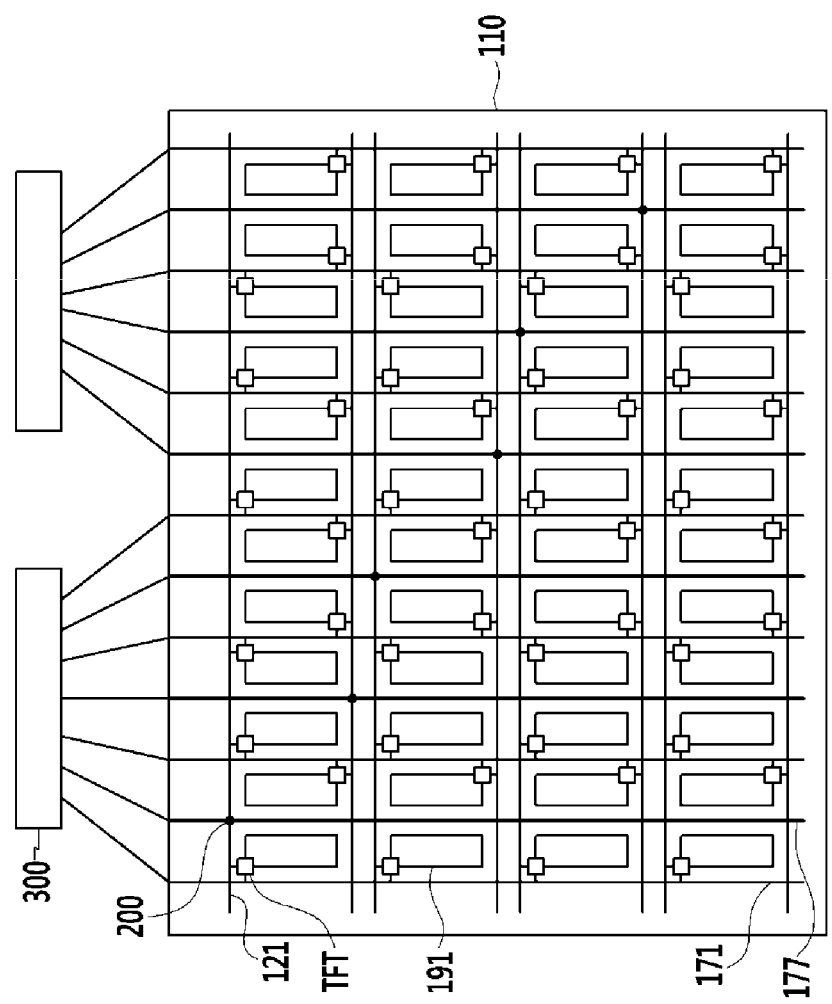
FIG. 1 is a plan view schematically illustrating a thin film transistor display panel according to an exemplary embodiment.

Example embodiments will be described more fully hereinafter with reference to the accompanying drawings, in which the exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

First, a thin film transistor display panel according to an exemplary embodiment will be described below with reference to the accompanying drawings.

FIG. 1 is a plan view schematically illustrating a thin film transistor display panel according to an exemplary embodiment.

The thin film transistor display panel according to an exemplary embodiment includes a plurality of gate lines 121 and data lines 171 which are formed so as to cross each other on a substrate 110, as shown in FIG. 1

The gate lines 121 are formed in a horizontal direction and the data lines 171 are formed in a vertical direction. A plurality of pixel areas are defined by the crossed gate lines 121 and data lines 171. One pixel area is defined by two adjacent gate lines 121 and two adjacent data lines 171. For example, one pixel area is defined by the first and second gate lines 121 from the upper side of substrate 110, and the first and second data lines 171 from the left side of substrate 110. Another pixel area is defined by the third and fourth gate lines 121 from the upper side, and the first and second data lines 171 from the left side.

A plurality of gate voltage supply lines 177 are formed in a parallel direction with the data lines 171 so as to cross the center of the pixel areas. The plurality of gate voltage supply lines 177 are formed to cross the gate lines 121, and one gate voltage supply line 177 is connected with one gate line 121. Connection parts 200, where the gate voltage supply lines 177 and the gate lines 121 are connected to each other, are represented by dots at intersections of the voltage supply lines 177 and gate lines 121 in FIG. 1. Signals applied to the gate voltage supply lines 177 are transferred to the gate lines 121 that are connected to the gate voltage supply lines through the connection parts 200. For example, the first gate voltage supply line 177 from the left side is connected the first gate line 121 from the upper side, and the second gate voltage supply line 177 from the left side is connected to the second gate line 121 from the upper side. Further, the third gate voltage supply line 177 is connected to the third gate line 121, and the fourth gate voltage supply line 177 is connected to the fourth gate line 121, and so on.

The gate voltage supply lines 177 may be formed to extend from one side edge of the substrate 110 to a position where the gate line 121 closest to the other side edge of the substrate 110 is formed. That is, all of the gate voltage supply lines 177 may be formed with substantially the same length. As a result, each of the gate voltage supply lines 177 has the same area overlapped with the gate line 121, such that capacitance generated by the overlap of the gate voltage supply line 177 and the gate line 121 may be the same for every gate voltage supply line 177.

The thin film transistor (TFT) connected to the gate line 121 and the data line 171 is formed at a position adjacent to a point where the gate line 121 and the data line 171 cross each other. The thin film transistor (TFT) is a switching element capable of controlling an on/off state. A control terminal of the TFT is connected to the gate line 121, and an input terminal of the TFT is connected to the data line 171.

A plurality of thin film transistors (TFTs) are connected to each data line 171 and, in this case, the plurality of thin film transistors (TFTs) may be alternately disposed at one side and the other side of the data line 171. Further, two thin film transistors (TFTs) which are connected to the same data line 171 and disposed between two adjacent gate lines 121 may be connected to different gate lines 121.

For example, the thin film transistors (TFTs) that are connected to the second data line 171 from the left side of the substrate 110 will be described. The first thin film transistor (TFT) from the upper side of the substrate 110 that connected to the second data line 171 from the left side is disposed on the right side of the second data line 171 to be connected with the first gate line 121. The second thin film transistor (TFT) is disposed on the left side of the second data line 171 to be connected with the second gate line 121. The third thin film transistor (TFT) is disposed on the right side of the second data line 171 to be connected with the third gate line 121, and the fourth thin film transistor (TFT) is disposed on the left side of the second data line 171 to be connected with the fourth gate line 121, and so on. That is, the plurality of thin film transistors (TFTs) connected to the second data line 171 are alternately disposed on the right side and the left side of the second data line 171.

The pixel electrode 191 connected with the thin film transistor (TFT) is formed in a pixel area defined by the gate line 121 and the data line 171. Two pixel electrodes 191 are formed in one pixel area. For example, two pixel electrodes 191 are formed in a pixel area defined by the first and second gate lines 121 from the upper side of the substrate 110 and the first and second data lines 171 from the left side of the substrate 110. The left pixel electrode 191 of two pixel electrodes 191 is connected with the first gate line 121 and the first data line 171 by the thin film transistor (TFT), and the right pixel electrode 191 is connected with the second gate line 121 and the second data line 171 by the thin film transistor (TFT).

The gate voltage supply line 177 is formed so as to pass between the two pixel electrodes that are formed in the same pixel area. For example, the gate voltage supply line 177 passes between two pixel electrodes 191 formed in a pixel area defined by the first and second gate lines 121 from the upper side of the substrate 110 and the first and second data lines 171 from the left side of the substrate 110.

A driving unit 300 is connected to the gate voltage supply lines 177 and the data lines 171. The driving unit 300 is formed at an outer side of the substrate 110. The driving unit 300 supplies a gate signal to the gate voltage supply line 177 and supplies the data signal to the data line 171. That is, the driving unit 300 may integrate the gate signal and the data signal to control and transmit an integrated gate signal and data signal.

In an exemplary embodiment, a gate driver for driving the gate line 121 and a data driver for driving the data line 171 are not separately formed, and a driving unit 300 is formed which is capable of controlling the gate line 121 and the data line 171 together. Accordingly, the driving unit 300 is formed along one side of the substrate 110, and the size of the bezel may be minimized at the other three sides of the driving unit 300.

In FIG. 1, the driving unit 300 is disposed at an outer side, or edge, of the substrate 110, but the present invention is not limited thereto, and the driving unit 300 may, for example, be attached on the substrate 110 and may also be directly formed on the substrate 110 through a photolithography process.

Hereinafter, one pixel of the thin film transistor display panel according to the exemplary embodiment will further be described.

Figure 2:
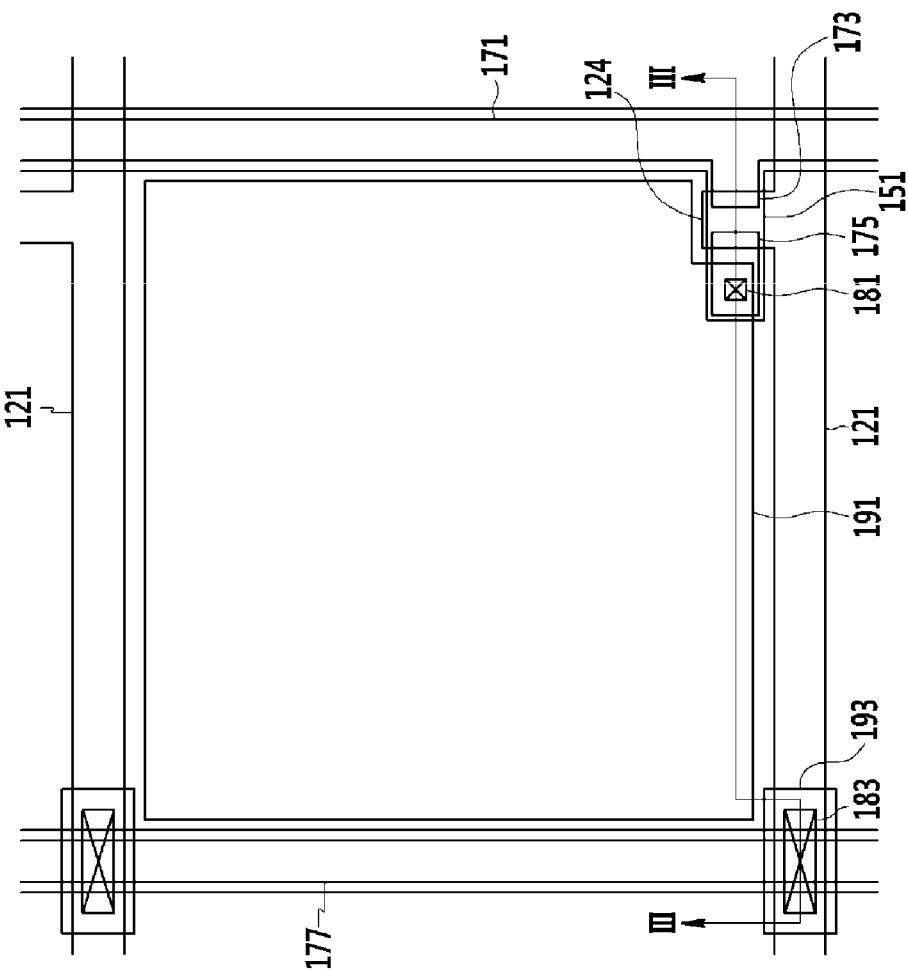
FIG. 2 is a plan view illustrating one pixel of the thin film transistor display panel according to the exemplary embodiment.
Figure 3:
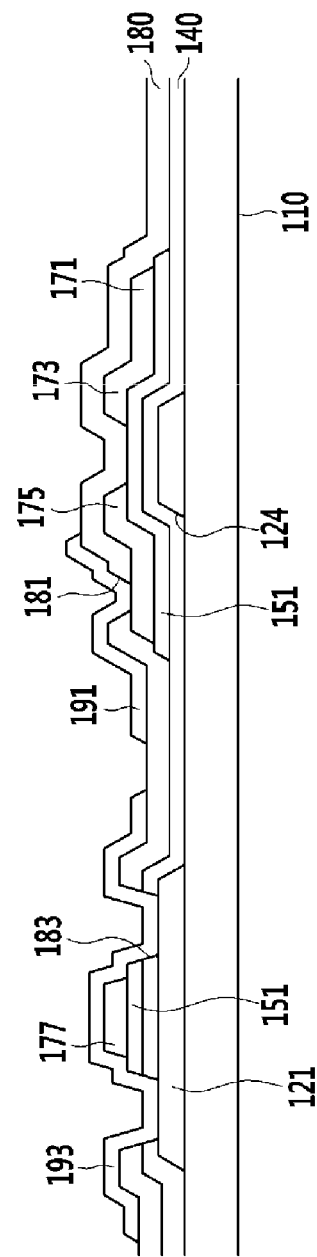
FIG. 3 is a cross-sectional view of the thin film transistor display panel according to the exemplary embodiment which is shown along line III-III of FIG. 2.

FIG. 2 is a plan view illustrating one pixel of the thin film transistor display panel according to the exemplary embodiment and FIG. 3 is a cross-sectional view of the thin film transistor display panel according to the exemplary embodiment which is shown along line III-III of FIG. 2.

In the thin film transistor display panel according to the exemplary embodiment, the gate lines 121 are formed on the substrate 110 which is made of a material such as glass, plastic, or the like in one direction. A gate electrode 124 protruding from the gate line 121 is also formed on the substrate. The gate electrode 124 is connected with the gate line 121 and thus the gate signal is applied through the gate line 121.

A gate insulating layer 140 is formed on the entire surface of the substrate 110 including the gate lines 121 and the gate electrode 124. The gate insulating layer 140 may be made, for example, of silicon nitride (SiNx) or silicon oxide (SiOx) and may also be formed of a double layer of silicon nitride and silicon oxide.

A semiconductor layer 151 is formed on the gate insulating layer 140. The semiconductor layer 151 may be formed, for example, of an amorphous silicon semiconductor, a polysilicon semiconductor, an oxide semiconductor, or the like.

On the semiconductor layer 151, the data line 171 and the gate voltage supply line 177 are formed to be parallel to each other so as to cross the gate line 121. A source electrode 173 protruding above the gate electrode 124 from the data line 171 and a drain electrode 175 separated from the source electrode 173 are formed.

The source electrode 173 and the drain electrode 175 are separated from each other on the gate electrode 124. The semiconductor layer 151 includes a channel part formed at a portion where the source electrode 173 and the drain electrode 175 are separated from each other, and current flows through the channel part.

The semiconductor layer 151 is overlapped with the data line 171, the gate voltage supply line 177, the source electrode 173, and the drain electrode 175 except for the channel part so as to have substantially the same boundaries.

In the case where the semiconductor layer 151 is formed by a polysilicon semiconductor, an oxide semiconductor, or the like, because electron mobility may be increased as compared with the amorphous silicon semiconductor, line widths of the data line 171 and gate voltage supply line 177 may be designed to be relatively smaller.

A passivation layer 180 is formed on the data line 171, the gate voltage supply line 177, the source electrode 173, and drain electrode 175. The passivation layer 180 may be made, for example, of an inorganic insulating material or an organic insulating material, and may also be formed by a double layer of the inorganic insulating material and the organic insulating material.

A first contact hole 181 exposing a part of the drain electrode 175 is formed on the passivation layer 180. Further, second contact holes 183 exposing parts of the gate line 121 and the gate voltage supply line 177 are formed on the gate insulating layer 140 and the passivation layer 180.

The second contact holes 183 are formed in the gate insulating layer 140 which is disposed around an intersection of the gate line 121 and the gate voltage supply line 177, and also formed in the passivation layer 180 which is disposed at the intersection of the gate line 121 and the gate voltage supply line 177. The second contact holes 183 are form around, or at the edges of, the intersection. That is, the gate insulating layer 140 that is disposed at the intersection of the gate line 121 and the gate voltage supply line 177 is not entirely removed from below the gate voltage supply line 177, but a portion remains.

A part of the gate voltage supply line 177 disposed at the intersection of the gate line 121 and the gate voltage supply line 177 is exposed by the second contact hole 183, and a part of the gate line 121 disposed around the intersection of the gate line 121 and the gate voltage supply line 177 is exposed.

On the passivation layer 180, a pixel electrode 191 connected with the drain electrode 175 through the first contact hole 181 is formed. The pixel electrode 191 is disposed between two adjacent gate lines 121 and disposed between the adjacent data line 171 and gate voltage supply line 177. The pixel electrode 191 may be made of a transparent metal material such as, for example, indium tin oxide (ITO), indium zinc oxide (IZO), and the like.

On the passivation layer 180, a connection electrode 193 connected with the gate line 121 and the gate voltage supply line 177 through the second contact holes 183 is formed. The connection electrode 193 is formed to cover the gate line 121 and the gate voltage supply line 177, which are exposed by the second contact holes 183 at the intersection of the gate line 121 and the gate voltage supply line 177. The connection electrode 193 also covers area around the intersection of the gate line 121 and the gate voltage supply line 177. Because the gate line 121 and the gate voltage supply line 177 are connected to each other by the connection electrode 193, when a gate signal is applied to the gate voltage supply line 177, the gate signal is transferred to the gate line 121. The connection electrode 193 may be formed on the same layer as the pixel electrode 191 and with the same material as the pixel electrode 191.

Next, a thin film transistor display panel according to another exemplary embodiment will be described with reference to the accompanying drawings.

Because the thin film transistor display panel according to another exemplary embodiment is similar to the exemplary embodiment described above with reference to FIGS. 2 and 3, certain repetitive description is omitted and the differences between the embodiments will be described below. A main difference is at the structure of a connection part, where the gate line and the gate voltage supply line are connected with each other.

Figure 4:
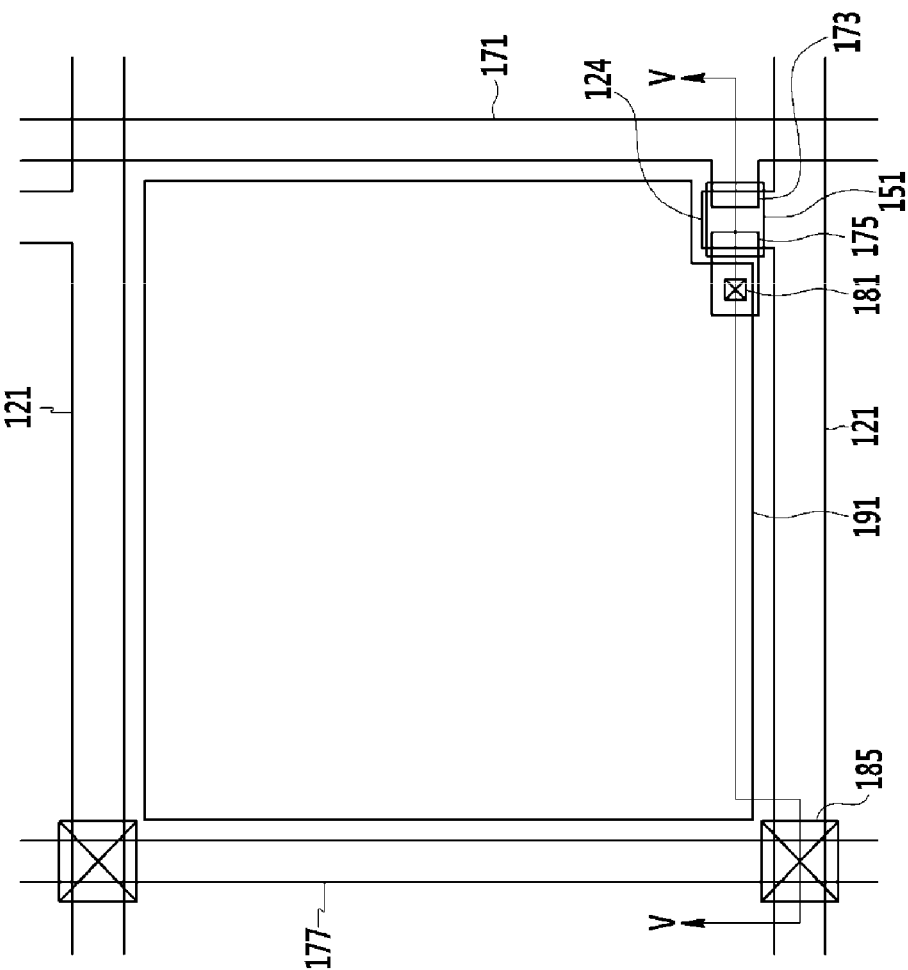
FIG. 4 is a plan view illustrating one pixel of a thin film transistor display panel according to another exemplary embodiment.
Figure 5:
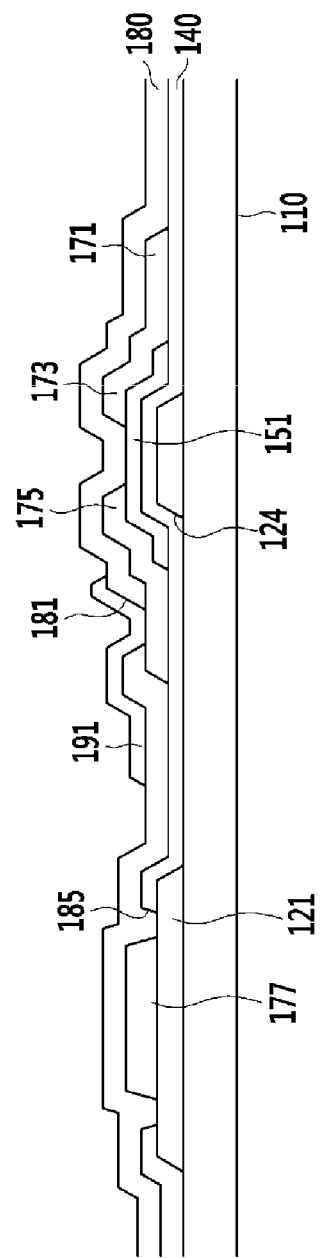
FIG. 5 is a cross-sectional view of the thin film transistor display panel according to another exemplary embodiment which is shown along line V-V of FIG. 4.

FIG. 4 is a plan view illustrating one pixel of a thin film transistor display panel according to another exemplary embodiment and FIG. 5 is a cross-sectional view of the thin film transistor display panel according to another exemplary embodiment which is shown along line V-V of FIG. 4.

A schematic structure of a thin film transistor display panel according to another exemplary embodiment in FIG. 4 is similar to the thin film transistor display panel according to the exemplary embodiment shown in FIG. 1.

In one pixel of the thin film transistor display panel according the present exemplary embodiment, as shown in FIGS. 4 and 5, a gate line 121 and a gate electrode 124 are formed on a substrate 110, and a gate insulating layer 140 is formed on the gate line 121 and the gate electrode 124.

A third contact hole 185 exposing a part of the gate line 121 is formed in the gate insulating layer 140. In this case, the third contact hole 185 may also be formed so as to expose part of the gate line 121 and the vicinity thereof as shown in FIG. 5.

A semiconductor layer 151 is formed on the gate insulating layer 140. The semiconductor layer 151 is formed to be disposed on the gate electrode 124.

The data line 171 and the gate voltage supply line 177 are formed to be parallel to each other so as to cross the gate line 121, and the source electrode 173 protruding from the data line 171 and the drain electrode 175 separated from the source electrode 173 are formed.

The gate voltage supply line 177 is connected with the gate line 121 through the third contact hole 185. The third contact hole 185 is formed in the gate insulating layer 140 which is disposed at the intersection of the gate line 121 and the gate voltage supply line 177. A part of the gate line 121 which is disposed at the intersection of the gate line 121 and the gate voltage supply line 177 is exposed by the third contact hole 185. The gate voltage supply line 177 is formed so as to cover, and to come into direct contact with, the exposed gate line 121, such that the gate line 121 and the gate voltage supply line 177 are connected with each other.

The semiconductor layer 151 is formed above the gate electrode 124 and around the gate electrode 124 and below portions of both the source electrode 173 and the drain electrode 175. The semiconductor layer 151 is not formed below the data line 171 and the gate voltage supply line 177.

The passivation layer 180 is formed on the data line 171, the gate voltage supply line 177, the source electrode 173, and the drain electrode 175.

A first contact hole 181 exposing a part of the drain electrode 175 is formed in the passivation layer 180.

The pixel electrode 191 is formed on the passivation layer 180 and is connected to the drain electrode 175 through the first contact hole 181. The pixel electrode 191 is disposed between two adjacent gate lines 121 and is disposed between the adjacent data line 171 and gate voltage supply line 177.

In the exemplary embodiment illustrated in FIGS. 4 and 5, a separate connection electrode to connect the gate line 121 and gate voltage supply line 177 is not formed, and the gate line 121 and the gate voltage supply line 177 are directly connected with each other through the third contact hole 185.

Next, a thin film transistor display panel according to yet another exemplary embodiment will be described below with reference to the accompanying drawings.

Because the thin film transistor display panel according to yet another exemplary embodiment is similar to exemplary embodiment described above with reference to FIGS. 1-3, certain repetitive description is omitted, and the differences between the embodiments will be described below. A main difference is that lengths of a plurality of gate voltage supply lines are different from each other in the present exemplary embodiment.

Figure 6:
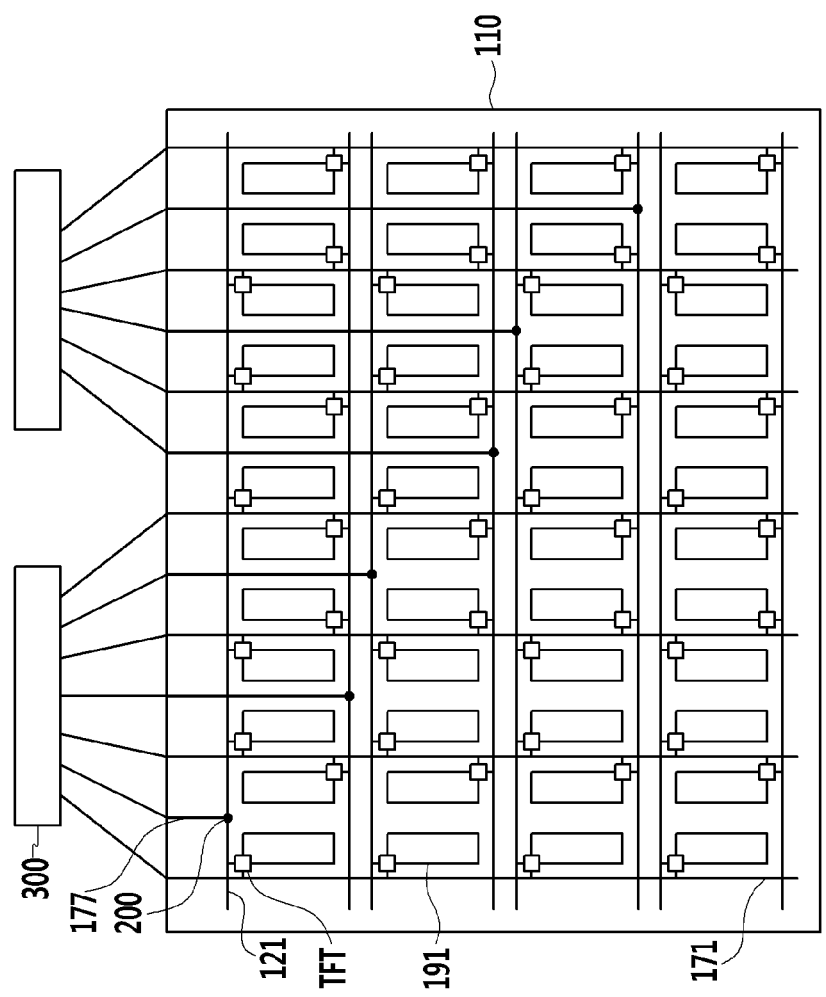
FIG. 6 is a plan view schematically illustrating a thin film transistor display panel according to yet another exemplary embodiment.

FIG. 6 is a plan view schematically illustrating a thin film transistor display panel according to yet another exemplary embodiment.

A structure of one pixel of a thin film transistor display panel according to yet another exemplary embodiment may be formed to be the same as one pixel of the exemplary embodiment shown in FIGS. 2 and 3, and may also be formed to be the same as one pixel of the exemplary embodiment shown in FIGS. 4 and 5.

The thin film transistor display panel according to the present exemplary embodiment includes a plurality of gate lines 121 and data lines 171 which are formed to cross each other on the substrate 110, as shown in FIG. 6. One pixel area is defined by two adjacent gate lines 121 and two adjacent data lines 171.

A plurality of gate voltage supply lines 177 are formed in a direction parallel with the data lines 171 so as to cross the center of the pixel areas. The plurality of gate voltage supply lines 177 cross the gate lines 121, and one gate voltage supply line 177 is connected with one gate line 121. The connection parts 200 connecting the gate voltage supply lines 177 and the gate lines 121 are represented by dots.

Each of the gate voltage supply lines 177 may be formed to extend from one side edge of the substrate 110 to the connection part 200 connecting the corresponding gate voltage supply line 177 with the gate line 121. For example, the first gate voltage supply line 177 from the left side of the substrate 110 is connected with the first gate line 121 from the upper side of the substrate 110, and is formed to extend from an upper edge of the substrate 110 to the connection part 200 that is connected to the first gate line 121. Further, the second gate voltage supply line 177 from the left side of the substrate 110 is connected with the second gate line 121 from the upper side of the substrate 110, and is formed to extend from the upper edge of the substrate 110 to the connection part 200 that is connected to the second gate line 121. Lengths of the plurality of gate voltage supply lines 177 are formed, in the example shown in FIG. 6, to be shorter toward the left side of the substrate 110 and to be longer toward the right side of the substrate 110. That is, the plurality of gate voltage supply lines 177 may be formed to have different lengths.

The position of each connection part 200 shown in FIG. 6 is for purposes of illustration, but is not limited thereto and the connection parts 200 may be formed in various positions. For example, the first gate voltage supply line 177 from the left side of the substrate 110 may also be formed to be connected with the final gate line 121 of the substrate 110.

Further, the data lines 171 and the gate voltage supply lines 177 do not need to be formed in the same numbers. When the number of the gate voltage supply lines 177 formed is smaller than the number of the data lines 171, there may be pixel areas through which the gate voltage supply lines 177 do not pass. In addition, when the number of the data lines 171 formed is smaller than the number of the gate voltage supply lines 177, the gate voltage supply lines 177 may also be formed along the outer portion of the panel.

Next, a manufacturing method of a thin film transistor display panel according to an exemplary embodiment will be described below with reference to the accompany drawings.

FIGS. 7 to 10 are cross-sectional views illustrating a manufacturing method of a thin film transistor display panel according to an exemplary embodiment. The thin film transistor display panel manufactured in the present exemplary embodiment has the same structure as the thin film transistor display panel shown in FIGS. 1 to 3.

Figure 7:
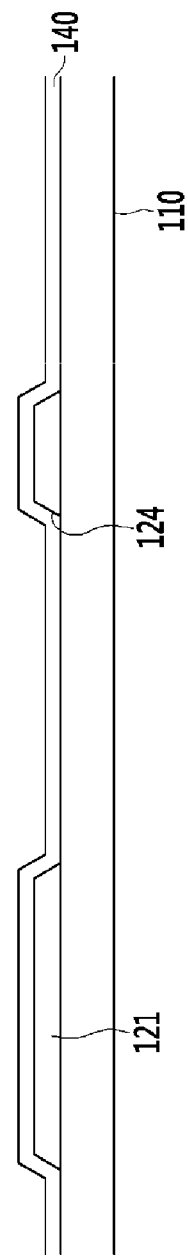
FIGS. 7 to 10 are process cross-sectional views illustrating a manufacturing method of a thin film transistor display panel according to an exemplary embodiment.

First, as shown in FIG. 7, the gate lines 121 and the gate electrodes 124 protruding from the gate lines 121 are formed on the substrate 110, which is made of glass, plastic, or the like.

Next, the gate insulating layer 140 is formed by using an insulating material such as, for example, silicon oxide or silicon nitride on the entire surface of the substrate 110 including the gate lines 121 and the gate electrodes 124. The gate insulating layer 140 may be formed in a single layer or a multi layer.

Figure 8:
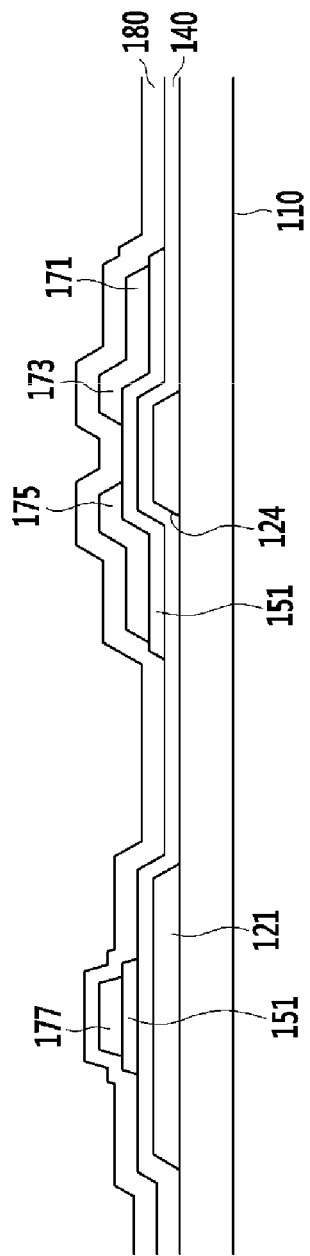

As shown in FIG. 8, the semiconductor layer 151 is formed on the gate insulating layer 140 by sequentially depositing and patterning a semiconductor material and a metal material on the gate insulating layer 140 at the same time. Further, the data line 171 and the gate voltage supply line 177 are formed on the semiconductor layer 151. The data line 171 and voltage supply line 177 are formed so as to cross the gate line 121. The source electrode 173 is formed protruding from the data line 171 onto the gate electrode 124, and the drain electrode 175 is also formed and is separated from the source electrode 173.

The source electrode 173 and the drain electrode 175 are formed to be separated from each other on the gate electrode 124 to form a channel part in the semiconductor layer 151.

Except for the channel part, the semiconductor layer 151 has substantially the same boundaries as the data line 171, the gate voltage supply line 177, the source electrode 173, and the drain electrode 175 to be overlapped with each other.

The semiconductor layer 151, the data line 171, the gate voltage supply line 177, the source electrode 173, and drain electrode 175 may be formed at the same time by using one mask. In this case, a slit mask or a halftone mask may be used.

The semiconductor material may be formed, for example, by an amorphous silicon semiconductor, a polysilicon semiconductor, an oxide semiconductor, or the like. In this case, in the case of using the polysilicon semiconductor, the oxide semiconductor, or the like as the semiconductor material, electron mobility may be increased as compared with the case of using the amorphous silicon semiconductor, such that line widths of the data line 171 and the gate voltage supply line 177 may be designed to be relatively smaller.

The metal material may be made of various metals.

Next, the passivation layer 180 is formed on the entire surface of the substrate 110 that includes the semiconductor layer 151, the data line 171, the gate voltage supply line 177, the source electrode 173, and the drain electrode 175. The passivation layer 180 may be made of, for example, an inorganic insulating material or an organic insulating material and may also be formed in a double layer of the inorganic insulating material and the organic insulating material.

Figure 9:
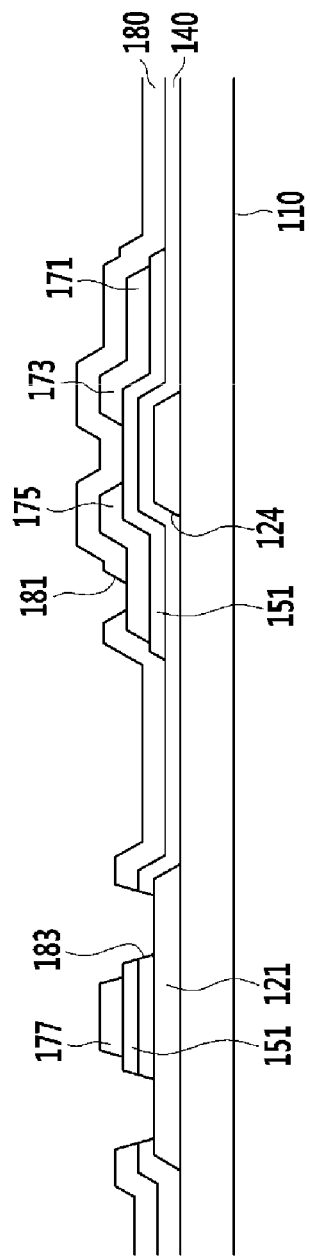

As shown in FIG. 9, the first contact hole 181 exposing a part of the drain electrode 175 is formed by patterning the gate insulating layer 140 and the passivation layer 180, and simultaneously, second contact holes 183 exposing parts of the gate line 121 and the gate voltage supply line 177 are formed.

The second contact holes 183 are formed by etching the portions of the gate insulating layer 140 and the passivation layer 180 that are disposed at the intersection of the gate line 121 and the gate voltage supply line 177, and also around the intersection. In this case, the portion of the gate insulating layer 140 that is disposed on gate line 121 at the intersection of the gate line 121 and the gate voltage supply line 177 is not removed by etching because the gate voltage supply line 177 is formed thereon.

By the formation of the second contact hole 183, a part of the gate voltage supply line 177 which is disposed at the intersection of the gate line 121 and the gate voltage supply line 177 is exposed, and a part of the gate line 121 which is disposed around the intersection of the gate line 121 and the gate voltage supply line 177 is exposed.

Figure 10:
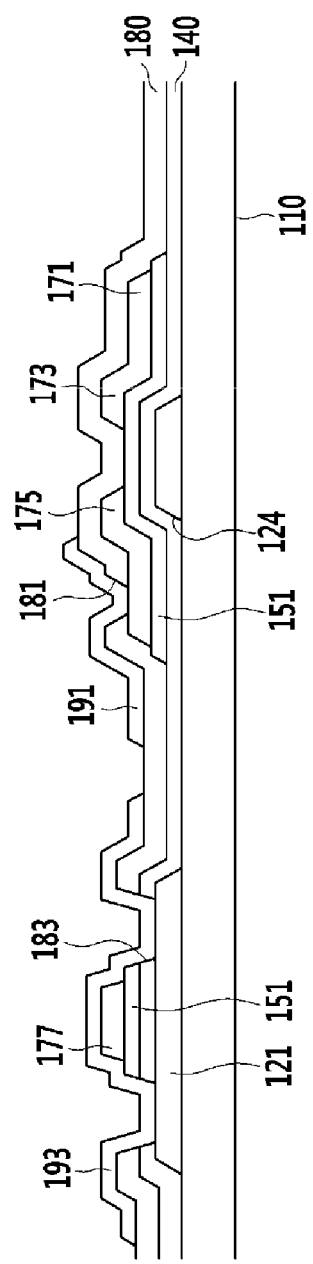

As shown in FIG. 10, the pixel electrode 191 that is connected to the drain electrode 175 through the first contact hole 181 is formed by depositing and patterning a transparent metal material such as, for example, indium tin oxide (ITO), indium zinc oxide (IZO), or the like on the passivation layer 180. Simultaneously, a connection electrode 193 connected with the gate line 121 and the gate voltage supply line 177 through the second contact hole 183 is formed.

The connection electrode 193 may be formed at the intersection of the gate line 121 and the gate voltage supply line 177 and around the intersection so as to cover the portions of the gate line 121 and the gate voltage supply line 177 that are exposed by the second contact hole 183. When a gate signal is applied to the gate voltage supply line 177, the gate signal is transferred to the gate line 121 through the connecting electrode 193 that connects the gate line 121 and the gate voltage supply line 177.

Next, a manufacturing method of a thin film transistor display panel according to another exemplary embodiment will be described below with reference with the accompanying drawings.

Because a manufacturing method of a thin film transistor display panel according to another exemplary embodiment is similar to the exemplary embodiment described above, certain repetitive description is omitted and the differences will be described below. A main difference from the above-described exemplary embodiment is a process of forming a connection part connecting the gate line and the gate voltage supply line.

FIGS. 11 to 14 are process cross-sectional views illustrating a manufacturing method of a thin film transistor display panel according to another exemplary embodiment. A thin film transistor display panel manufactured in the exemplary embodiment has the same structure as the thin film transistor display panel shown in FIGS. 1, 4, and 5.

Figure 11:
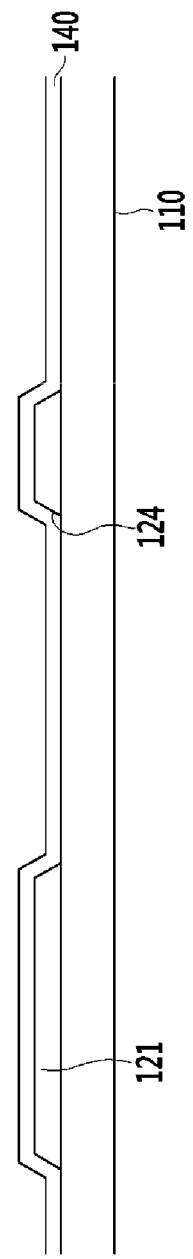
FIGS. 11 to 14 are process cross-sectional views illustrating a manufacturing method of a thin film transistor display panel according to another exemplary embodiment.

First, as shown in FIG. 11, the gate line 121 and the gate electrode 124 protruding from the gate line 121 are formed on the substrate 110.

Next, the gate insulating layer 140 is formed on the entire surface of the substrate 110 including the gate line 121 and the gate electrode 124.

Figure 12:
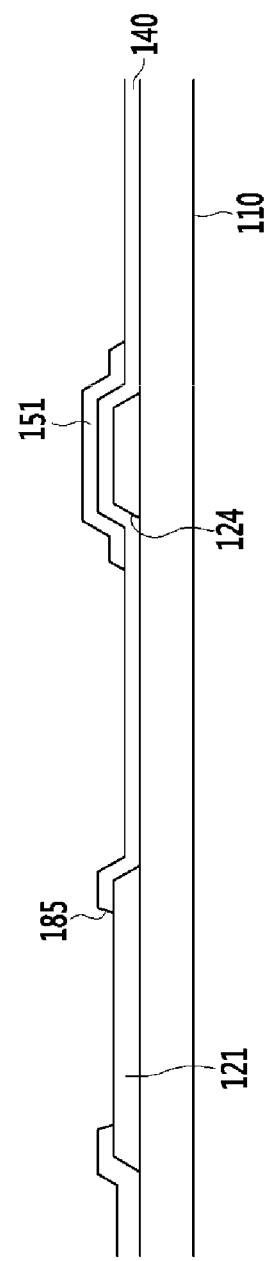

As shown in FIG. 12, a third contact hole 185 exposing a portion of the gate line 121 is formed by patterning the gate insulating layer 140.

Next, the semiconductor layer 151 is formed on the gate insulating layer 140. The semiconductor layer 151 may be formed to be disposed on the gate electrode 124.

As described above, the semiconductor layer 151 is formed after the third contact hole 185 is first formed, but the present invention is not limited thereto and may also perform by changing the order. For example, after the semiconductor layer 151 is first formed on the gate insulating layer 140, the third contact hole 185 may be formed by patterning the gate insulating layer 140.

Figure 13:
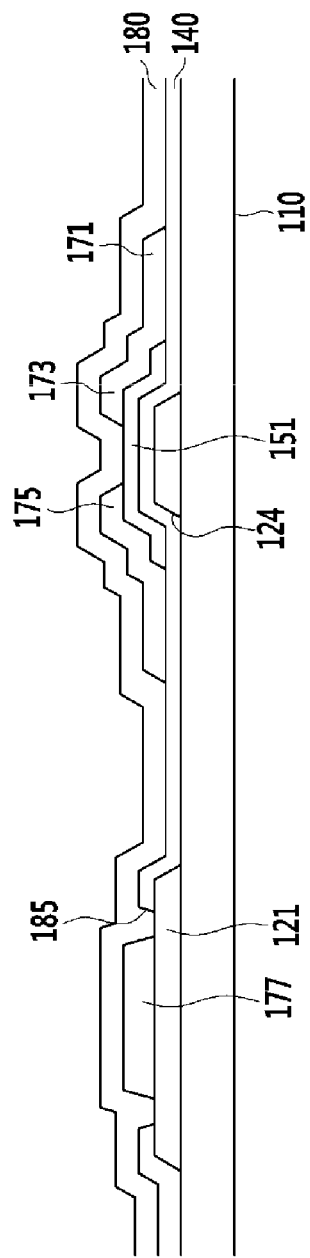

As shown in FIG. 13, metal materials are deposited and then patterned on the gate insulating layer 140 and the semiconductor layer 151 to form the data line 171 and the gate voltage supply line 177 so as to cross the gate line 121. Simultaneously, the source electrode 173 protruding from the data line 171 onto the gate electrode 124 and the drain electrode 175, which is separated from the source electrode 173, are formed. The source electrode 173 and the drain electrode 175 are formed to be separated from each other on the gate electrode 124.

The gate voltage supply line 177 is formed to be connected with the gate line 121 through the third contact hole 185. That is, the gate voltage supply line 177 is formed so as to cover, and be in direct contact with, the gate line 121 exposed by the third contact hole 185, to connect the gate voltage supply line 177 with the gate line 121.

Next, the passivation layer 180 is formed on the entire surface of the substrate 110 including the semiconductor layer 151, the data line 171, the gate voltage supply line 177, the source electrode 173, and the drain electrode 175.

Figure 14:
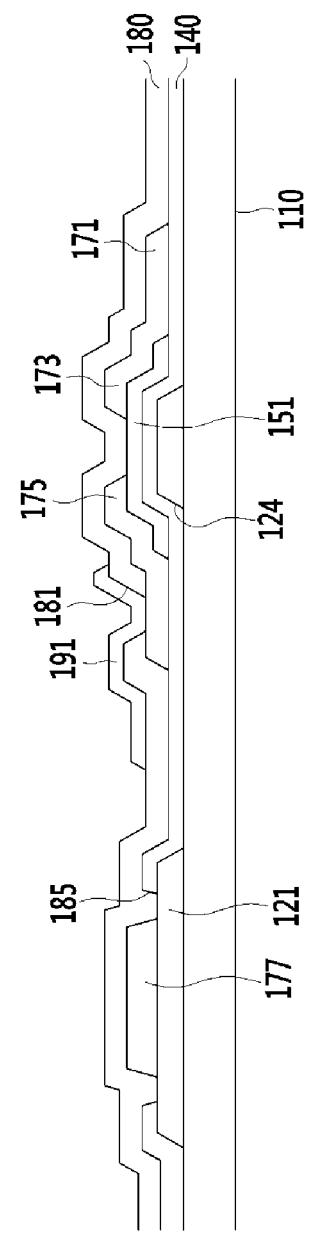

As shown in FIG. 14, the first contact hole 181 exposing a portion of the drain electrode 175 is formed by patterning the passivation layer 180.

Next, the pixel electrode 191 connected to the drain electrode 175 through the first contact hole 181 is formed on the passivation layer 180.

While embodiments has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure including the appended claims.

<Description of symbols>

| | |
|---|---|
| 121: Gate line | 124: Gate electrode |
| 140: Gate insulating layer | 151: Semiconductor layer |
| 171: Data line | 173: Source electrode |
| 175: Drain electrode | 177: Gate voltage supply line |
| 180: Passivation layer | 181: First contact hole |
| 183: Second contact hole | 185: Third contact hole |
| 191: Pixel electrode | 193: Connection electrode |
| 200: Connection part | 300: Driving unit |

What is claimed is:

1. A thin film transistor display panel, comprising:
   a substrate;
   a plurality of gate lines and data lines which cross each other on the substrate;
   thin film transistors connected to the gate lines and the data lines;
   a pixel electrode connected to each of the thin film transistors;
   a plurality of gate voltage supply lines arranged on the substrate in a parallel direction with the data lines and each connected to one of the plurality of gate lines, each of the gate voltage supply lines crossing the gate lines at an intersection area, wherein the gate voltage supply lines do not directly contact the gate lines; and
   a gate insulating layer between the gate lines and the gate voltage supply lines, and positioned on each of the gate lines in a center region of the intersection area to expose an upper surface of each of the gate lines on both sides of the gate insulating layer,
   a connection electrode configured to connect the gate voltage supply line and the gate line,
   wherein the connection electrode covers an upper portion and side portion of the gate voltage supply line at an intersection of the gate voltage supply line and the gate line, and the connection electrode covers the upper surface of each of the gate lines at both sides of the gate insulating layer,
   wherein a pixel area is defined by two adjacent gate lines and two adjacent data lines, and
   the gate voltage supply lines pass between two pixel electrodes formed in a same pixel area.

2. The thin film transistor display panel of claim 1, wherein:
   the plurality of gate voltage supply lines extend from one side edge of the substrate to a gate line closest to an opposite side edge of the substrate.

3. The thin film transistor display panel of claim 2, wherein:

the plurality of gate voltage supply lines are substantially a same length.

4. The thin film transistor display panel of claim 1 wherein:
each of the plurality of gate voltage supply lines extends from one side edge of the substrate to a different one of the connection parts, respectively.

5. The thin film transistor display panel of claim 1, wherein:
the connection electrode is on a same layer as the pixel electrode and with a same material as the pixel electrode.

6. The thin film transistor display panel of claim 1, further comprising:
a driving unit connected to the gate voltage supply line and the data line.

7. The thin film transistor display panel of claim 6, wherein:
the driving unit supplies a gate signal to the gate voltage supply line and supplies a data signal to the data line.

8. The thin film transistor display panel of claim 1, wherein:
the thin film transistors are alternately disposed at one side and an opposite side of the data line.

9. The thin film transistor display panel of claim 8, wherein:
two thin film transistors, which are connected to a same data line and disposed between two adjacent gate lines, are connected to different gate lines.

* * * * *